(12) United States Patent
Shieh et al.

(10) Patent No.: US 7,605,026 B1
(45) Date of Patent: Oct. 20, 2009

(54) SELF-ALIGNED TRANSPARENT METAL OXIDE TFT ON FLEXIBLE SUBSTRATE

(75) Inventors: Chan-Long Shieh, Paradise Valley, AZ (US); Hsing-Chung Lee, Calabasas, CA (US)

(73) Assignee: CBRITE, Inc., Goleta, CA (US)

( * ) Notice: Subject to any disclaimer, the term of this patent is extended or adjusted under 35 U.S.C. 154(b) by 0 days.

(21) Appl. No.: 11/949,477

(22) Filed: Dec. 3, 2007

(51) Int. Cl.
*H01L 29/49* (2006.01)
(52) U.S. Cl. ............... 438/151; 257/346; 257/E29.151; 438/149; 438/364
(58) Field of Classification Search ................. 430/270, 430/311; 438/149
See application file for complete search history.

(56) References Cited

U.S. PATENT DOCUMENTS 5,545,576 A * 8/1996 Matsumoto et al. ......... 438/160
5,994,173 A * 11/1999 Oki et al. .................... 438/161
6,580,127 B1 * 6/2003 Andry et al. ................. 257/347
2004/0207777 A1 * 10/2004 Hiroki et al. .................. 349/92
2005/0046776 A1 * 3/2005 Ahn et al. .................... 349/141
2007/0059868 A1 * 3/2007 Huang et al. ................. 438/151

* cited by examiner

*Primary Examiner*—Wael Fahmy
*Assistant Examiner*—Morgan Varner
(74) *Attorney, Agent, or Firm*—Parsons & Goltry; Robert A. Parsons; Michael W. Goltry

(57) ABSTRACT

A method of fabricating self-aligned metal oxide TFTs on transparent flexible substrates is disclosed and includes the steps of providing a transparent flexible substrate with at least an opaque first metal TFT electrode in a supporting relationship on the front surface of the substrate and a layer of transparent material, including at least one of a metal oxide semiconductor and/or a gate dielectric, on the front surface of the substrate and the first metal TFT electrode. A layer of photoresist is positioned in overlying relationship to the layer of transparent material. Dual photo masks are positioned over the front and rear surfaces of the substrate, respectively, and the layer of photoresist is exposed. The layer of photoresist is developed and used to form a layer of second metal.

18 Claims, 4 Drawing Sheets

US 7,605,026 B1

SELF-ALIGNED TRANSPARENT METAL OXIDE TFT ON FLEXIBLE SUBSTRATE

FIELD OF THE INVENTION

This invention generally relates to the use of transparent metal oxides in the self-alignment and fabrication of TFTs.

BACKGROUND OF THE INVENTION

The figure of merit in thin film transistors (TFTs) is defined by $\mu V/L^2$ where $\mu$ is the mobility, V is the voltage and L is the gate length. The voltage is constrained by the cost of the driver. There are two major problems in flexible TFT technology. The first problem stems from the fact that semiconductor material that can be used in TFTs is severely limited by the maximum temperatures to which flexible substrates can be subjected, i.e. approximately 200° C. This limitation of fabrication temperatures generally results in low mobility of semiconductor material. This problem is partially remedied by the recent advance in metal oxide semiconductor materials in which mobility is as high as 80 $cm^2$/V-sec has been demonstrated. The second problem is the long gate length. Even though lithography resolution on flexible substrates can be as low as 5 microns, the gate length has to be much larger in order to ensure a minimum overlap between the gate and the source/drain. The gate metal and the source/drain metal are defined in separate lithography steps and the alignment between them is critical. Due to the deformation of flexible substrates during fabrication, perfect alignment is difficult. In order to ensure the required overlap, the gate length has to be oversized. But the large resulting overlap between the gate and the source/drain creates a large overlap capacitance that seriously degrades the speed performance of the device. A self-aligned technology is needed to ensure that the gate and source/drain are properly aligned with minimum overlap.

It would be highly advantageous, therefore, to remedy the foregoing and other deficiencies inherent in the prior art.

Accordingly, it is an object of the present invention to provide new and improved methods of fabricating self-aligned metal oxide TFTs on flexible substrates.

It is another object of the present invention to provide new and improved methods of fabricating metal oxide TFTs on flexible substrates using a minimum of process steps.

SUMMARY OF THE INVENTION

Briefly, to achieve the desired objects of the instant invention in accordance with a preferred embodiment thereof, provided is a method of fabricating self-aligned metal oxide TFTs on transparent flexible substrates. The method includes a steps of providing a transparent flexible substrate and positioning at least an opaque first metal TFT electrode in a supporting relationship on the front surface of the substrate. The method further includes a step of depositing a layer of transparent material, including at least one of a metal oxide semiconductor and a gate dielectric, on the front surface of the substrate and the first metal TFT electrode. A layer of photoresist is positioned in overlying relationship to the layer of transparent material. A first photo mask is positioned over the rear surface of the substrate in non-critical alignment and portions of the layer of photoresist are exposed using the first photo mask and using the opaque first metal TFT electrode as a self-alignment mask. A second photo mask is positioned over the front surface of the substrate in non-critical alignment and portions of the layer of photoresist are exposed using the second photo mask. The layer of photoresist is developed and a layer of second metal is formed using the developed layer of photoresist.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
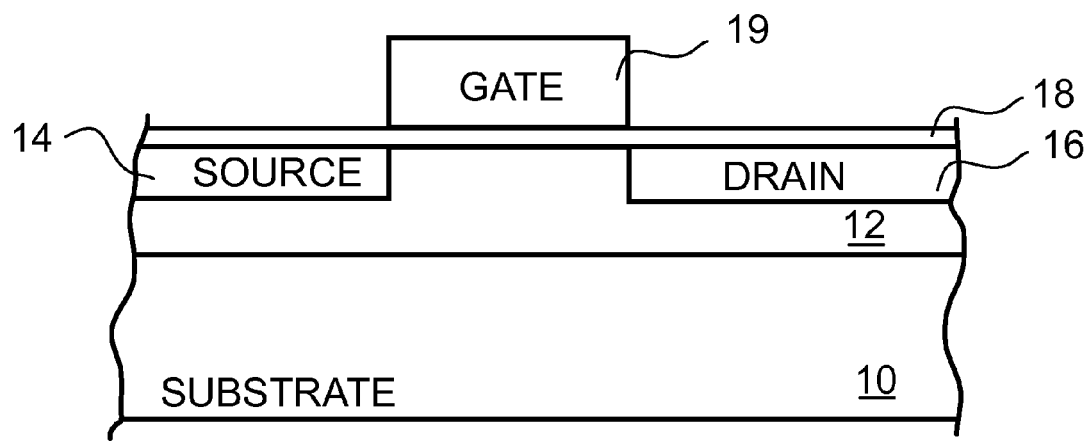
FIGS. 1-3 illustrate different self-aligning processes and resulting structures in the fabrication of TFTs.
Figure 2:
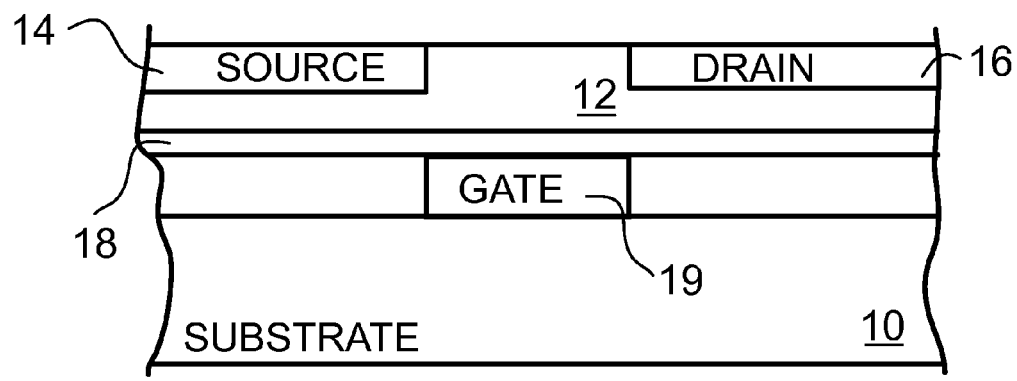
Figure 3:
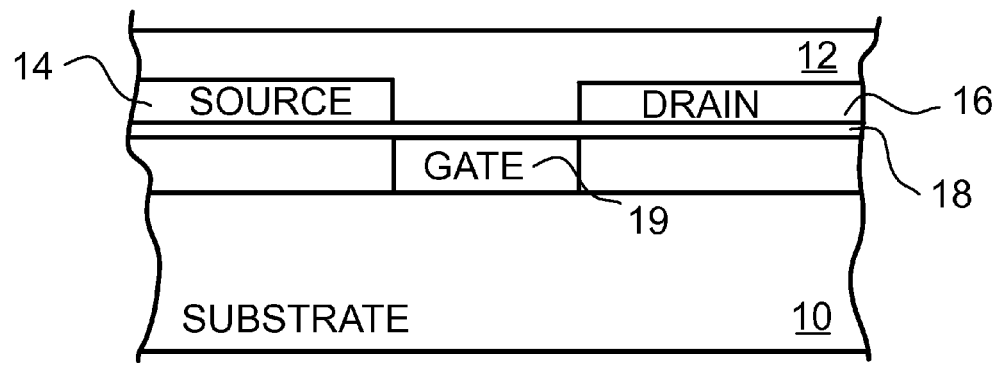

Turning now to the drawings, attention is first directed to FIGS. 1-3, which illustrate three different self-aligning processes and the three resulting structures in the fabrication of thin film transistors (TFTs). For purposes of simplifying the disclosure set forth below of the new processes for fabricating TFTs, the three different self-aligning processes and the three resulting structures are discussed in detail first and at least one of the three will be assumed to be incorporated into the later described processes. Also, in each different process it should be noted that an opaque first metal TFT electrode is positioned in a supporting relationship on the surface of the substrate and the second metal is patterned on a transparent layer situated between the two metals.

In each of the three different structures or TFTs a flexible substrate 10 is illustrated, which may be formed of any of the well known flexible substrate materials, such as plastic, etc. Generally, substrate 10 is transparent to whatever illumination is utilized in the self-aligning fabrication process. Throughout this disclosure it should be understood that the terms "transparent" and "opaque" apply only to the specific illumination utilized in the specific process. Also, in each of the three different structures or TFTs a layer 12 of metal oxide semiconductor material is utilized to define a transistor channel between a source electrode 14 and a drain electrode 16. Generally, the metal oxide semiconductor material is transparent to whatever illumination is utilized in the self-aligning fabrication process. Examples of typical transparent metal oxides that can be utilized as the semiconductor channel include ZnO, InO, InZnO, and InGaZnO. Finally, in accordance with well known transistor principles, a thin layer of gate dielectric 18 is utilized to separate a gate electrode 19 from the semiconductor channel. Here it will be understood that a self-aligned technology is needed to ensure that the gate and source/drain are properly aligned with minimum overlap to provide TFTs with a high figure of merit.

Referring specifically to FIG. 1, layer 12 of metal oxide semiconductor material is deposited directly on the surface of substrate 10. Source electrode 14 and drain electrode 16 are the first metal in this procedure and are formed on layer 12 by any of the well known methods. Gate dielectric layer 18 is deposited on layer 12 and source electrode 14 and drain electrode 16. Gate electrode 19, which is the second metal in this example, is formed on the surface of gate dielectric layer 18 using some variation of a self-aligning process in which a layer of photoresist is exposed or illuminated through substrate 10 using opaque source electrode 14 and opaque drain electrode 16 as a mask. This process ensures proper alignment of gate electrode 19 with minimum overlap of source electrode 14 and drain electrode 16 and, thus, a minimum gate length.

Referring specifically to FIG. 2, gate electrode 19, the first metal in this example, is formed directly on the surface of substrate 10. Here it will be understood that materials on either side of gate 19 may be some form of dielectric material utilized to planarize the structure or may simply be left unplanarized. Gate dielectric layer 18 is deposited over at least gate 19 (and generally the planarizing material). Layer 12 of metal oxide semiconductor material is deposited directly on the surface of gate dielectric layer 18. Source electrode 14 and drain electrode 16, which are the second metal in this example, are formed on the surface of layer 12 using some variation of a self-aligning process in which a layer of photoresist is exposed or illuminated through substrate 10 using opaque gate electrode 14 as a mask. This process ensures proper alignment of source electrode 14 and drain electrode 16 with minimum overlap of gate electrode 19 and, thus, a minimum gate length.

Referring specifically to FIG. 3, gate electrode 19, the first metal in this example, is formed directly on the surface of substrate 10. Here it will be understood that materials on either side of gate 19 may be some form of dielectric material utilized to planarize the structure or may simply be left unplanarized. Gate dielectric layer 18 is deposited over at least gate 19 (and generally the planarizing material). Source electrode 14 and drain electrode 16, which are the second metal in this example, are formed on the surface of gate dielectric layer 18 using some variation of a self-aligning process in which a layer of photoresist is exposed or illuminated through substrate 10 using opaque gate electrode 14 as a mask. This process ensures proper alignment of source electrode 14 and drain electrode 16 with minimum overlap of gate electrode 19 and, thus, a minimum gate length. Layer 12 of metal oxide semiconductor material is deposited on the surface of source electrode 14 and drain electrode 16.

Using the opaque first metal for photo processing, the same or a reverse image of the first metal can be created, depending upon the type of photoresist being used. Regardless of the photo processing used, the same or reverse image created by using the opaque first metal as a mask self-aligns the edges of the first metal, e.g. gate electrode 19, with the edges of the second metal, e.g. source electrode 14 and drain electrode 16. Thus, the self-alignment ensures minimum overlap in the critical area. However, this is not enough because the gate electrode pattern is not exactly the reverse pattern of the source electrode 14 and drain electrode 16. Another supplementary patterning step is needed to complete the source, drain, and gate electrodes and to create more degrees of freedom in the design. The critical alignment is achieved by the same or reverse image process. The alignment between the supplementary pattern and the first or second metal is not critical. The novel patterning process of the present disclosure allows more degrees of freedom and allows more low cost options in the supplementary patterning technique. The goal is to reduce the process complexity and to maintain the self-alignment features in the critical area.

Figure 4:
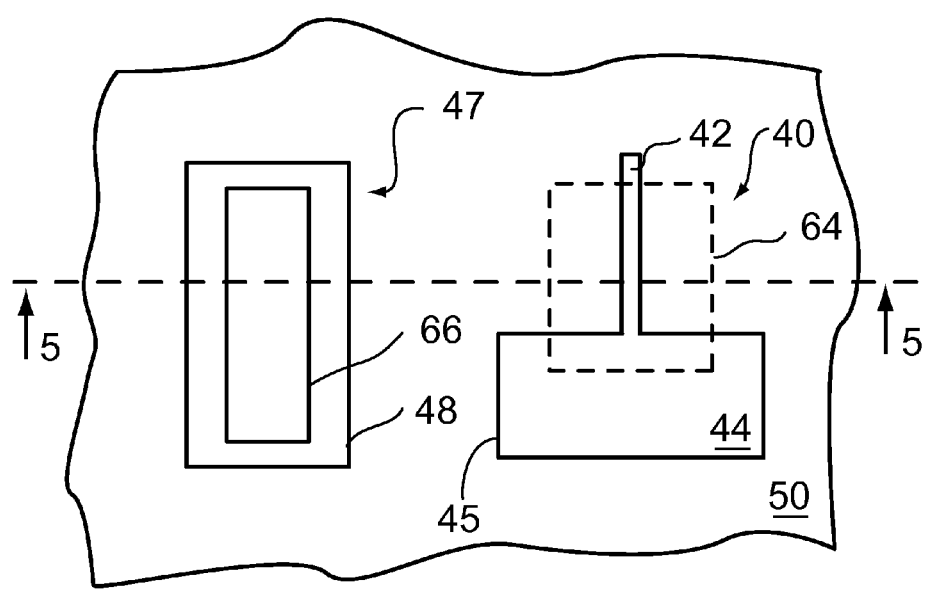
FIG. 4 is a top plan view of a TFT with self-aligned electrodes and some surrounding structure fabricated in accordance with the present invention.
Figure 5:
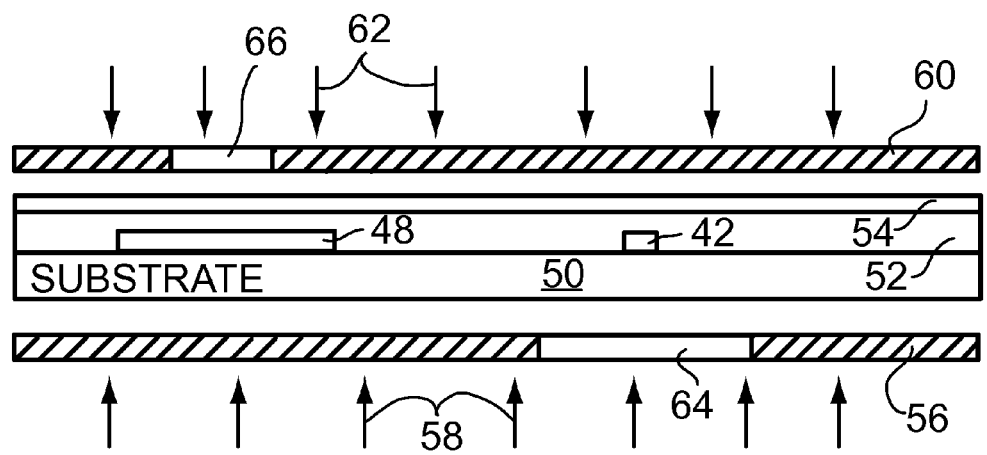
FIG. 5 is a sectional view as seen from the line 5-5 in FIG. 4, illustrating one embodiment of a method in accordance with the present invention.
Figure 6:
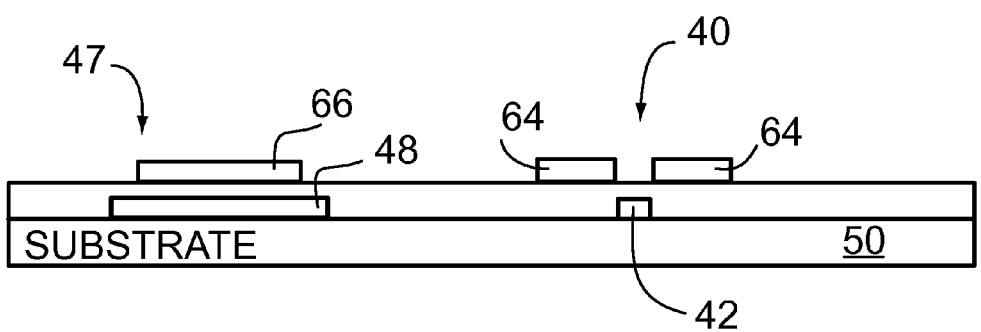
FIG. 6 is a sectional view, similar to FIG. 5, illustrating the resulting product of the method illustrated in FIG. 5.

Turning now to FIGS. 4-6, a TFT 40 with self-aligned electrodes and some surrounding structure fabricated in accordance with the present invention. Referring specifically to FIG. 4, it can be seen that gate electrode 42 has a connecting pad 44 electrically connected thereto for applying signals to gate electrode 42. In this example line 45 surrounds and defines gate electrode 42 and connecting pad 44. Also, an additional component, which in this example may be a thin film capacitor 47, has a first electrode defined by a line 48. Lines 45 and 48 outline the opaque first metal areas deposited on a transparent flexible substrate 50.

While several different processes may be used to deposit the second metal, one process known as a lift-off process is preferred. The lift-off process also includes two different metallization possibilities. In a first lift-off process, a layer of positive photoresist is exposed (patterned) through a photo mask or the like and the exposed photoresist is dissolved or removed. Seeding colloidal particles are deposited on top of the remaining photoresist and the clear areas (i.e. over the entire structure). The thickness of the seeding layer is very thin (<20 nm) and can be lifted off easily. The remaining photoresist with the overlying seeded area is lifted off by dissolving and electroless metal plating is selectively deposited on the remaining seeded area to get the desired thickness. In a second lift-off process, a layer of positive photoresist is exposed (patterned) through a photo mask or the like and the exposed photoresist is dissolved or removed. Metal is deposited on the remaining photoresist and clear areas. The metal overlying the remaining photoresist is lifted off by dissolving the remaining photoresist. For the lift-off mechanism to achieve self-alignment in the above examples, a positive photoresist is used.

Referring specifically to FIG. 5, a sectional view as seen from the line 5-5 in FIG. 4 illustrates the preferred process including the masks and exposure illumination, in accordance with the present invention. In this example, utilized for purposes of explanation only, the opaque first metal areas (i.e. gate electrode 42/44 and first electrode 48 of thin film capacitor 47) outlined by lines 45 and 48 are deposited on transparent flexible substrate 50. A transparent layer 52 overlying the first metal represents the various layers of material (e.g. gate dielectric layer 18 and/or layer 12 of metal oxide semiconductor material). A layer 54 of positive photoresist is deposited over transparent layer 52 in accordance with one of the above described lift-off processes.

A bottom photo mask 56 is positioned over the lower surface of substrate 50 and illuminated from below (the rear side of substrate 50) with a source represented by arrows 58. In this specific example, photo mask 56 has a clear area 64, illustrated in FIG. 4 by a broken line. A second photo mask 60 is positioned over the upper surface of photoresist layer 54 and illuminated from above with a source represented by arrows 62. In this specific example, photo mask 60 has a clear area 66, illustrated in FIG. 4 by a solid line. Here it will be understood that, because substrate 50 and transparent layer 52 are both transparent to the illumination sources 58 and 62, photo mask 56 is constructed to define pattern in the complementary area of the first metal pattern and photo mask 60 is constructed to define pattern in the overlap area of the first metal pattern. Further, in the areas exposed by photo masks 56 and 60 alignment is non-critical with, in this example, the only critical alignment being accomplished by using gate electrode 42 as a portion of the mask. Thus, by properly designing photo mask 56, as shown in FIG. 5, the critical alignment is maintained even though photo mask 56 is not accurately aligned. Also, it will be understood that photo masks 56 and 60 can be used at different times but are always used on the same layer 60 of photoresist material.

Figure 7:
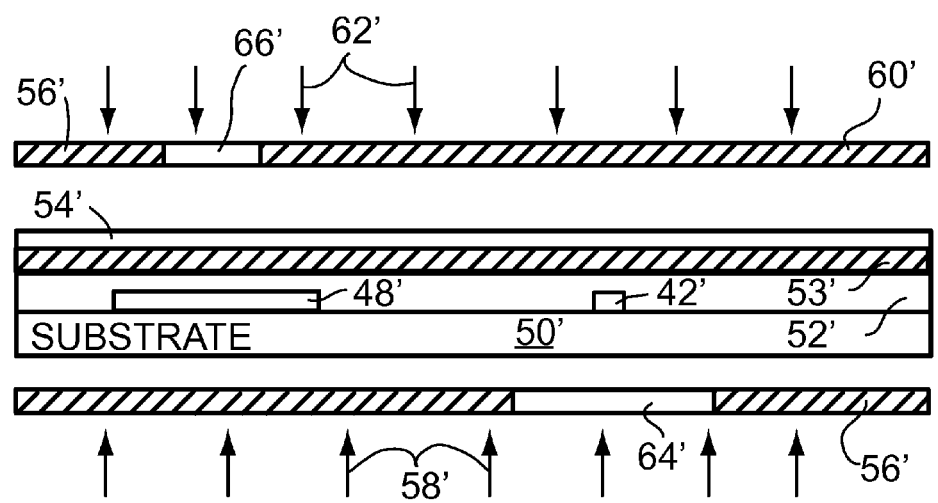
FIG. 7 is a sectional view similar FIG. 5, illustrating another embodiment in accordance with the present invention.

Referring additionally to FIG. 6, a sectional view illustrating the resulting product of the process steps illustrated in FIG. 5. In this simplified example, gate electrode 42 is illustrated along with the complete source and drain electrodes of thin film transistor 40. Clearly the outer edges of the source and drain electrodes, defined by line 64 or clear area 64 of mask 56, are non-critical and were formed by the positioning of photo mask 56. Also, the clear area 66 in mask 60 resulted in second metal 66 above first metal 48 to form, for example, a thin film capacitor. Additional electrical connections or other components can be formed using the disclosed techniques. In applications where a second metal pattern is desired on top of the first metal pattern the second or top photo mask 60 must be used. Here it should be noted that Referring specifically to FIG. 7, a different embodiment for producing the structure of FIG. 6 is illustrated. In the embodiment of FIG. 7 components that are the same as those in FIG. 5 are designated with similar numbers and a prime (') is added to indicate the different embodiment. In this embodiment a layer 53' of a transparent second metal is deposited on the surface of transparent layer 52' A layer 54' of negative photoresist is deposited on the upper surface of layer 53'. By using negative photoresist, the result is that exposed portions harden and remain in place. The first metal and masks 56' and 60' are the same as discussed in conjunction with FIG. 5. The negative photoresist is patterned and unexposed portions are washed away or removed with the exposed portions remaining and acting as an etch mask. Using the etch mask, transparent metal layer 53' is etched to leave only second metal components as illustrated in FIG. 6.

A third process for fabricating the structure illustrated in FIG. 6 is based on the printing of a conductor, such as silver paste or a conducting polymer. Again a positive photoresist is used and patterned, as explained in conjunction with FIG. 5. The printing is inhibited in unexposed areas and receptive in the exposed areas.

In each application the particular process to use will depend upon other steps in the process and the specific type of second metal that may be desired. Also, it will be understood that any of the variations described in conjunction with FIGS. 1-3 can be incorporated as well as variations on the specific type of metallization and the type of photoresist used.

Thus, several processes have been disclosed for forming TFTs and additional components on flexible substrates. All of the metals are deposited at low temperatures by any of the variety of methods disclosed. Because the only critical alignment is provided by self-aligned methods and because the remainder of the second metal does not require critical alignment, the patterning step is performed using two photo masks for double exposure from the top and the bottom.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating self-aligned metal oxide TFTs on transparent flexible substrates comprising the steps of:
   providing a transparent flexible substrate having a front surface and a rear surface;
   positioning at least an opaque first metal TFT electrode in a supporting relationship on the front surface of the substrate;
   depositing a layer of transparent material, including at least one of a metal oxide semiconductor and a gate dielectric, on the front surface of the substrate and the first metal TFT electrode;
   positioning a layer of photoresist in overlying relationship to the layer of transparent material;
   positioning a first photo mask over the rear surface of the substrate in non-critical alignment;
   exposing portions of the layer of photoresist using the first photo mask and using the opaque first metal TFT electrode as a self-alignment mask;
   positioning a second photo mask over the front surface of the substrate in non-critical alignment;
   exposing portions of the layer of photoresist using the second photo mask; and
   developing the layer of photoresist and forming a layer of second metal using the developed layer of photoresist.

2. A method as claimed in claim 1 wherein the layer of photoresist is positive photoresist.

3. A method as claimed in claim 2 wherein the step of using the opaque first metal TFT electrode as a self-alignment mask includes producing a reverse image of the TFT electrode in the positive photo resist.

4. A method as claimed in claim 1 wherein the opaque first metal TFT electrode includes a gate electrode.

5. A method as claimed in claim 1 wherein the opaque first metal TFT electrode includes a source electrode and a drain electrode.

6. A method as claimed in claim 2 wherein the step of forming a layer of second metal using the developed layer of photoresist includes using a lift-off process.

7. A method as claimed in claim 1 wherein the layer of photoresist is negative photoresist.

8. A method as claimed in claim 7 further including a step of depositing a layer of transparent second metal between the layer of transparent material and the layer of photoresist and wherein the step of forming a layer of second metal using the developed layer of photoresist includes using an etch process.

9. A method as claimed in claim 1 wherein the portions of the layer of photoresist exposed through the first and second photo masks includes outer perimeters of electrodes of the TFT other than the opaque first metal TFT electrode.

10. A method of fabricating self-aligned metal oxide TFTs on transparent flexible substrates comprising the steps of:
   providing a transparent flexible substrate having a front surface and a rear surface;
   positioning a structure including at least an opaque first metal TFT electrode and a layer of transparent material on the front surface of the substrate;
   positioning a layer of photoresist in overlying relationship to the structure;
   positioning a first photo mask over the rear surface of the substrate in non-critical alignment;
   exposing portions of the layer of photoresist through the first photo mask and using the opaque first metal TFT electrode as a self-alignment mask in cooperation with the first photo mask;
   positioning a second photo mask over the front surface of the substrate in non-critical alignment;
   exposing portions of the layer of photoresist using the second photo mask;
   the first photo mask being constructed to define pattern in a complementary area of the opaque first metal TFT electrode and the layer of transparent material and the second photo mask being constructed to define pattern in an overlap area of the opaque first metal TFT electrode and the layer of transparent material; and developing the layer of photoresist and forming a layer of second metal using the developed layer of photoresist.

11. A method as claimed in claim 10 wherein the layer of photoresist is positive photoresist.

12. A method as claimed in claim 11 wherein the step of using the opaque first metal TFT electrode as a self-alignment mask includes producing a reverse image of the TFT electrode in the positive photo resist.

13. A method as claimed in claim 10 wherein the opaque first metal TFT electrode includes a gate electrode.

14. A method as claimed in claim 10 wherein the opaque first metal TFT electrode includes a source electrode and a drain electrode.

15. A method as claimed in claim 11 wherein the step of forming a layer of second metal using the developed layer of photoresist includes using a lift-off process.

16. A method as claimed in claim 10 wherein the layer of photoresist is negative photoresist.

17. A method as claimed in claim 16 further including a step of depositing a layer of transparent second metal between the layer of transparent material and the layer of photoresist and wherein the step of forming a layer of second metal using the developed layer of photoresist includes using an etch process.

18. A method as claimed in claim 10 wherein the portions of the layer of photoresist exposed through the first and second photo masks includes outer perimeters of electrodes of the TFT other than the opaque first metal TFT electrode.

* * * * *